United States Patent
Beer (10) Patent No.: US 10,191,098 B2
(45) Date of Patent: Jan. 29, 2019

(54) ELECTRONIC MEASUREMENT DEVICE AND METHOD FOR OPERATING AN ELECTRONIC MEASUREMENT DEVICE

(71) Applicant: Rohde & Schwarz GmbH & Co. KG, Munich (DE)

(72) Inventor: Matthias Beer, Neubiberg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 48 days.

(21) Appl. No.: 14/797,476

(22) Filed: Jul. 13, 2015

(65) Prior Publication Data
US 2017/0016953 A1    Jan. 19, 2017

(51) Int. Cl.
G01R 27/28   (2006.01)
G01R 31/28   (2006.01)

(52) U.S. Cl.
CPC ......... G01R 27/28 (2013.01); G01R 31/2837 (2013.01); G01R 31/2841 (2013.01)

(58) Field of Classification Search
CPC .......... G01R 31/2834; G01R 255/005; G01R 25/005; G01R 31/31924; G01R 31/40; G01R 31/2851
USPC ......................................... 324/750.01, 76.39
See application file for complete search history.

(56) References Cited

U.S. PATENT DOCUMENTS

| | | | | |
|---|---|---|---|---|
| 4,360,928 A | * | 11/1982 | Campbell | H04B 17/20 324/614 |
| 4,728,885 A | * | 3/1988 | DeSanto | G01R 31/2834 324/102 |
| 8,742,777 B2 | * | 6/2014 | Kim | G01R 31/2822 324/500 |
| 2010/0188071 A1 | * | 7/2010 | Kajouke | G01R 31/2837 324/76.39 |
| 2010/0289479 A1 | * | 11/2010 | Prance | H03H 11/1217 324/76.39 |
| 2012/0161800 A1 | * | 6/2012 | Ishida | G01R 31/31703 324/750.01 |
| 2012/0299606 A1 | * | 11/2012 | Oshima | G11C 29/56012 324/750.01 |
| 2014/0111184 A1 | | 4/2014 | Dalebroux | |

OTHER PUBLICATIONS

Frick, Marco, Robert Weigel, and Roland Eidher. "A method to determine the injected real power into an Ic Pin in case of a conducted immunity Emc test." Electromagnetic Compatibility (Emc), 2011 IEEE International Symposium on. IEEE, 2011.*

(Continued)

*Primary Examiner* — Christopher P McAndrew
(74) *Attorney, Agent, or Firm* — Lee & Hayes, PLLC (57) ABSTRACT

The invention relates to an electronic measurement device and a method for operating the electronic measurement device. The electronic measurement device comprises a signal generating unit which is configured to generate a signal that is applied to an input node of a device under test. The electronic measurement device comprises a controlling unit which is configured to control the signal generating unit in that the generated signal is at least adjustable in its signal frequency. Furthermore, the electronic measurement device comprises at least a receiving unit, wherein the receiving unit retrieves a signal from an output node of the device under test in time domain.

20 Claims, 8 Drawing Sheets

(56) References Cited

OTHER PUBLICATIONS

Frick, Marco, Robert Weigel, and Roland Eidher. "A method to determine the injected real power into an 1C Pin in case of a conducted immunity Emc test." Electromagnetic Compatibility (Emc), 2011 IEEE International Symposium on. IEEE, 2011.*

L. Angrisani, "Experimental Assessment of Modulated S -Parameters Reliability in Modeling and Testing Wideband Radio Frequency Amplifiers," in IEEE Transactions on Instrumentation and Measurement, vol. 55, no. 5, pp. 1474-1479, Oct. 2006. doi: 10.1109/Tim.2006.880251.*

* cited by examiner

ELECTRONIC MEASUREMENT DEVICE AND METHOD FOR OPERATING AN ELECTRONIC MEASUREMENT DEVICE

FIELD OF THE INVENTION

The invention relates to an electronic measurement device and a method for operating an electronic measurement device.

Before an electronic device can be used, it is necessary to test it in order to guarantee a normal behavior of the device under predefined conditions. Therefore test specifications exist which describe testing scenarios for such electronic devices, hereinafter referred to devices under test, short DUT. Preferably, DUTs that are used in applications such as automotive, medical, aerospace or defense need to fulfill those test specifications, since a malfunction of the DUT in such an application would cause massive damages. Thus, reliable tests are required. The tests guarantee a certain qualification standard of the tested DUT.

There exist several methods and procedures for testing and/or analyzing a DUT. The invention herein preferably relates but is not limited to an analyzing method during normally operating the DUT. Thus, it is necessary to apply at least one signal to the DUT as an input signal and to measure the respective output signal of the DUT.

The invention preferably relates to the analysis of different types of DUT's, such as amplifiers, attenuators, active devices, passive devices, connecting elements, signal paths, liquids, energy storage means or the like that are low-cost DUTs. The DUTs might comprise a working frequency range from DC to a few hundred Megahertz. Since the DUTs are low-cost products, the required analyzing methods need to be simple and cost-efficient.

BACKGROUND OF THE INVENTION

To generate a signal that is applied to a DUT, a signal source is necessary. Nowadays signal sources are used to apply the signal to the DUT. The output of the DUT is measured by an electronic measurement device. The signal source is physically separated from the measuring device. Since the electronic measurement device is separated from the signal source, elaborated alignment techniques are needed to align the applied signal with the received signal. Normally, trigger signals are used for such time-alignments.

Such testing equipment scenarios to analyze the specific DUT are expensive and increase the production costs of such DUTs in a mass production scenario. Thus, there is a need to reduce the production costs for DUTs but to ensure an analyzing of the DUTs with high accuracy.

In document US 2014/0111184 A1 a mixed-domain oscilloscope, short MDO, is described comprising a test signal output channel for applying a signal to a DUT's input node. The MDO further comprises an RF input channel to obtain an output signal of the DUT. A processing and controlling logic inside the MDO comprises an analog to digital converter, short ADC, and a Discrete Fourier transformation, short DFT, module to obtain a frequency response signal in the frequency domain. The frequency response signal is displayed on a display at the MDO.

Those MDO are expensive and comprise complex computing structures to obtain the frequency response signal from a DFT algorithm. Thus, those MDO are not applicable for testing the above mentioned DUTs in a cost-efficient manner.

There is a need to provide a low-cost measurement device useful to analyze and characterize the above-mentioned DUTs. The measurement device should be applicable to mass production scenarios in order to accelerate the production of such DUTs.

SUMMARY OF THE INVENTION

According to a first aspect of the invention, an electronic measurement device, preferably a digital oscilloscope, comprises a signal generation unit that is configured to generate a signal that is applied to an input node of a DUT. The measurement device further comprises a controlling unit which is configured to control the signal generation unit in that the generated signal is at least adjustable in its signal frequency. At least one receiving unit is used in the electronic measurement device to retrieve a signal from an output node of the DUT in time domain. The electronic measurement device comprises both, a signal generation unit and a receiving unit in order to analyze a DUT's behavior and/or to test the DUT according to predefined test specifications.

Thus, the DUT is analyzed during normal operating conditions of the DUT. Important DUT's behavior parameters, analyzed by the inventive measurement device, are for example the scattering parameters, short S-parameters. These S-Parameters are the elements of a scattering matrix and describe the electrical behavior of the DUT when undergoing various steady state stimuli by applied electrical signals. In order to derive S-parameters it is necessary to perform reflection measurements and a system error correction. One can also derive transmission parameters instead of S-Parameters.

The electronic measurement device preferably comprises both, a signal generation unit and a receiving unit into a common housing, so the parameters of the signal generation unit are preferably set by the controlling unit and those parameters are preferably used to obtain the DUT's parameters. Using one single electronic measurement device instead of the above-mentioned test equipment comprising an external signal source advantageously leads to an easier and loss-reduced alignment of the applied signal to the retrieved signal.

Knowing the parameters of the generated signal and furthermore retrieving the output signal from the output node of the DUT allows the analysis of the DUT and its specific behavior.

The signal generation unit generates a signal that is at least adjustable in its signal frequency. Thus it is possible to obtain a frequency response characteristic of the DUT for each specific adjusted signal frequency of the generated signal.

The receiving unit has a broad input bandwidth. This allows to use modulated and/or broadband signals which is not possible with a classical vector network analyzer. Thus, the at least one receiving unit is a broadband receiving unit and is preferably built as an oscilloscopes input channel. This is different to known network analyzing device in which an input node with small band width is used which is highly signal frequency dependent.

With this inventive concept, preferably those DUTs can be analyzed that comprise a low operating frequency, preferably from DC to several hundreds of Megahertz.

In a preferred embodiment, the controlling unit adjusts the signal frequency in a stepwise manner. Preferably, the step width is adjustable. Thus, sweeping through the frequency range of the DUT is possible, wherein the sweeping ranges from a predefined and preset start-frequency to a predefined and preset stop-frequency. The accuracy of the frequency response is dependent on the predefined and preset step-width of the generated signals adjustable signal frequency.

In a preferred embodiment, the generated signal is a quasi single-frequency-signal. Since the signal generation unit is a part of the electronic measurement device and is furthermore controlled with the controlling unit, the specific generated signal parameters are known to the electronic measurement device. Thus, a comparison between the retrieved signal and the generated signal can be obtained easily and subsequent calculations can be provided by the electronic measurement device.

Many electrical properties of DUTs may be expressed using S-parameters, such as gain, return loss, voltage standing wave ratio, short VSWR, power supply rejection ratio, short PSRR, common mode rejection ration, short CMRR and/or phase parameters. Those properties are preferably calculated for each adjusted signal value in the electronic measurement device. Additionally, cut-off frequencies, slope-rates and/or non-linearity parameters can be derived from the obtained frequency response.

In a preferred embodiment, the signal generation unit is an arbitrary wave form generator. The arbitrary wave form generator is built as a digital signal generation unit and uses ARB-files that are stored in storage means of the electronic measurement device. Those ARB files describe amplitude values, wave form values, modulation schemes and frequency values that are needed to generate the applied signal.

In a preferred embodiment, the electronic measurement device comprises at least a second receiving unit, wherein the second receiving unit retrieves the applied generated signal from the input node of the DUT. The second receiving unit is a broadband second receiving unit and is preferably built as an oscilloscopes input channel. Using the second receiving unit to retrieve the applied generated signal from the input node of the DUT allows a direct comparison of the signal applied at the input node of the DUT with the signal retrieved from the output node of the DUT without influences of cable losses or further distortions which are applied if probes are used to apply the generated signal and the applied signal is internally used in the measurement device without being retrieved from the DUT.

In a preferred embodiment, the controlling unit analyzes the DUT's behavior by comparing the generated signal and the retrieved signal. For this purpose, the control unit preferably comprises a calculation unit such as an application specific integrated circuit or a microprocessor or a signal processor in order to calculate the needed DUT's parameter derived from the comparison of the input signal and the output signal of the DUT.

In a preferred embodiment, a high-impedance probe is applied to an input node of the receiving unit, wherein the impedance of the high-impedance probe is higher than the impedance of the output node of the DUT. This high-impedance probe allows the measurement of the respective signal from the DUT without influencing the DUT's signal behavior such as an unwanted loading of the DUT.

In a preferred embodiment, the controlling unit comprises a correction unit that is configured to compensate an impedance mismatch between the receiving unit and the output node of the device under test. This might be necessary, in case the DUT comprises a termination impedance that is uncommon, e.g. a value different from 50 Ohms. Since the correction factor of the correction unit is know, the controlling unit is able to correct the mismatched value in order to obtain the DUT's behavior.

In an alternative embodiment, the termination of the DUT matches with the load.

In a preferred embodiment, the controlling unit comprises a correction unit that is configured to compensate an impedance mismatch between the signal generating unit and the input node of the device under test.

Preferably, the controlling unit is configured to calculate a gain value and/or a phase value by comparing the generated signal and the retrieved signal for each generated adjustable signal value. Thus, the frequency response of the DUT is obtained for the operating frequency of the DUT by sweeping the adjustable signal frequency. Thus, a cost efficient method is obtained by simply sweeping the signal frequency from a start frequency range value to a stop frequency value.

In a preferred embodiment, the measurement device comprises a display unit to display the generated signal and/or the retrieved signal and/or any signal derived from the controlling unit.

In a preferred embodiment the display unit is configured to display at least a signal in a frequency domain.

In a preferred embodiment, the device under test is an active element, such as a switchable attenuation device or an amplifier device. In another preferred embodiment, the DUT is a passive element, such as an inductance element, a capacitance element or a resistance element. Thus, the measurement device can be used as an LCR meter, for measuring material properties and so on.

Alternatively, the DUT is a conducting element, such as a cable, for instance a coaxial cable or the like. Such a cable is preferably analyzed in view of its transmission loss and reflection loss.

Alternatively, the DUT is analyzed in view of its material properties within a specific frequency range. Preferably, the DUT is thus analyzed in view of its spectroscopy features, such as an electrochemical impedance spectroscopy. This parameter might be useful to characterize a battery as a preferred DUT or a liquid as a preferred DUT, including oil, blood and a biological cell.

Thus, the inventive electronic measurement device allows analyzing a DUT according to its S-parameters, such as the transmission coefficient or the transmission loss as well as an electro-chemical impedance such as permittivity and conductivity as a function of frequency.

In another aspect of the invention, a method for operating an electronic measurement device comprises the following steps: Applying a generated signal to an input node of a DUT, wherein the generated signal is generated by a signal generation unit of the measurement device and wherein the generated signal is at least adjustable in its signal frequency by a controlling unit of the measurement device. Subsequently, a retrieving of an output signal from an output node of the DUT at a receiving unit of the measurement device is proceeded. Furthermore, a comparison of the retrieved signal with the generated signal by means of the controlling unit is proceeded to obtain parameters of the DUT. Finally, the comparison result is displayed at a display unit of the measurement device.

In a preferred embodiment, a normalization procedure is applied prior to the comparing step, wherein the normalization procedure comprises the following steps: shorting of an appropriate signal probe that is connected to the receiving unit for retrieving the signal from the output node of the device under test; stepwise adjusting the signal value of the generated signal; measuring the retrieved signal with the shorted probe; and storing the measured value for each adjusted signal value.

In a more preferred embodiment, a measurement definition procedure is applied prior to the comparing step wherein the measurement definition procedure comprises the following steps: defining of a measuring mode, such as a frequency measuring mode or a power measuring mode. Alternatively, the measuring mode defines a single-ended measuring mode or a differential measuring mode in order to achieve the CMRR of the DUT.

The measurement definition procedure furthermore comprises the step of setting the signal generation unit. Therein a setting of the start frequency of a stop frequency and/or of the step-width with predefined values is achieved.

The measurement definition procedure furthermore comprises the step of setting the adjustable value for the generated signal, such as the frequency value or the amplitude value or the phase value of the adjustable signal.

In a more preferred embodiment, the measurement definition procedure further comprises the step of defining a mismatch correction value of the DUT and the step of defining a measurement bandwidth and averaging value.

In a more preferred embodiment, the comparing step of the operating method includes the following steps: incorporating mismatch parameters of the DUT into the comparison; calculating a gain value from the generated signal and the retrieved signal for each adjusted signal value; and/or calculating a phase value between the generated signal and the retrieved signal for each adjusted signal value.

BRIEF DESCRIPTION OF THE DRAWINGS

In the following, exemplary embodiments of the invention are described with reference to drawings. Those exemplary embodiments do not limit the scope of the invention. The same reference signs in the different drawings indicate the same elements or at least the same functions, unless otherwise stated.

DETAILED DESCRIPTION OF THE PREFERRED EMBODIMENTS

Figure 1:
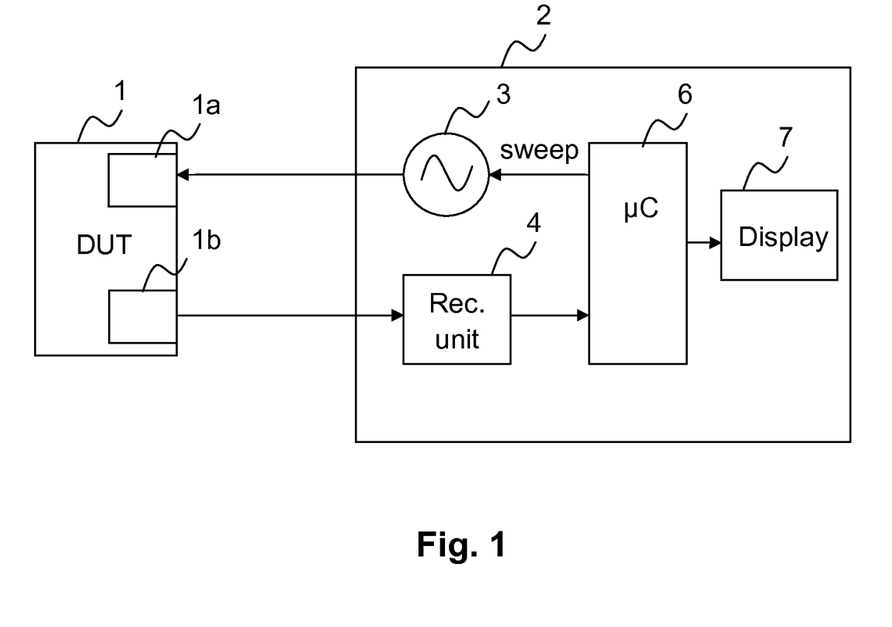
FIG. 1 shows a first exemplary embodiment of an electronic measurement device according to the invention.

FIG. 1 shows a first exemplary embodiment of an electronic measurement device 2 according to the invention connected to a DUT 1. The measurement device 2 comprises a signal generation unit 3 which generates a signal and provides the signal to an output of the measurement device 2. The measurement device 2 further comprises a receiving unit 4 which comprises an input node on which preferably a measurement probe is connected. The measurement device 2 further comprises a controlling unit 6 and a displaying unit 7. The output node of the measurement device 2 is connected to an input node 1a of the DUT 1. An output node 1b of the DUT 1 is connected to the receiving unit 4 of the measurement device 2, preferably via a measurement probe (not shown). The output node 1b of the DUT 1 is preferably connected to the receiving unit 4 by using a measurement probe with an impedance value of one Megaohm or higher in order to avoid an influencing of the output node 1b of the DUT 1.

In order to analyze the DUT 1, the signal generation unit 3 generates a signal that is adjustable within its signal value. In case, the frequency response of a specific parameter of the DUT 1 should be analyzed, the adjustable signal value might be a signal frequency value. To adjust the signal value, the controlling unit 6 of the measurement device 2 comprises means for sweeping the signal generating unit 3. Thus, a signal is applied to the input node 1a of the DUT 1 whose signal frequency varies within a predefined step-width in order to analyze the frequency response within a predefined frequency range of the DUT 1.

The DUT 1 is analyzed during operating conditions. Thus, the signal generating unit 3 provides an input signal to the DUT 1 which is processed by the DUT 1. The output node 1b of the DUT 1 provides the proceeded signal which is retrieved at the receiving unit 4. The DUT 1 might further be connected to a voltage supply (not shown) for supplying the DUT 1. The input node 1 and the output node 1b of the DUT 1 comprise a much lower impedance value in comparison to the input/output nodes of the measurement device 2. Thus the use of high-impedance signal probes for retrieving the signal does not influence or change the behavior of the DUT 1.

By sweeping the signal generating unit 3 with means of the controlling unit 6, it is now possible to obtain specific parameters of the DUT 1 for each specific adjusted signal value. The controlling unit 6 calculates these specific parameters from the retrieved signal of the receiving unit 4 and displays the parameters in the displaying unit 7.

Thus, an inventive measurement device 2 that comprises all necessary test equipment components into one common housing, especially the signal source 3, the receiving unit 4, the controlling/calculation unit 6 and the display unit 7 is obtained herewith. Thus, a measurement device 2 is obtained, that can be used to analyze the DUT 1 without further components needed and which does not influence the DUTs signals. The device under test 1 is preferably an operating amplifier or a passive element such as an inductance or capacitor or resistor. The analyzed parameters are preferably the gain, the phase, the CMRR and/or the PSRR, displayed in frequency-domain.

Figure 2:
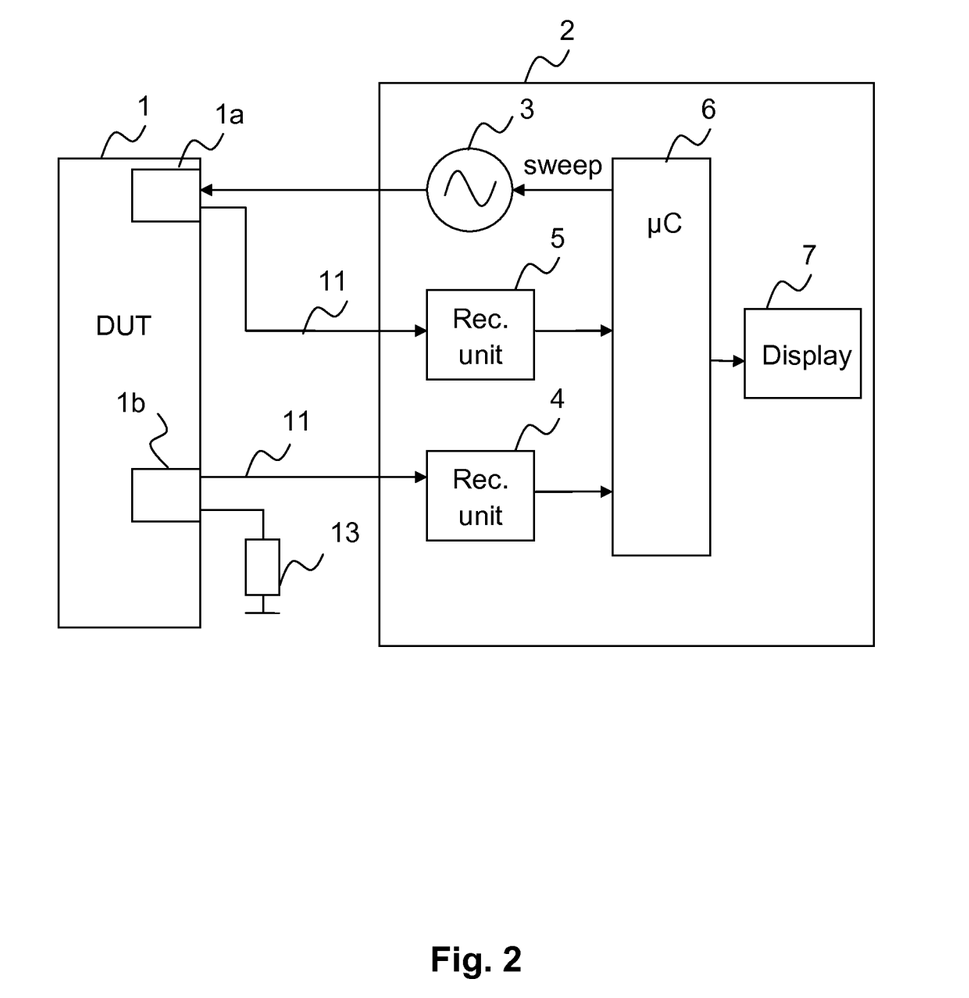
FIG. 2 shows a second exemplary embodiment of an electronic measurement device according to the invention.

In FIG. 2, a second exemplary embodiment of the inventive measurement device 2 is shown. To avoid unnecessary repetitions, only the differences between FIG. 1 and FIG. 2 are described in greater detail hereinafter. In contrast to FIG. 1, the measurement device 2 of FIG. 2 comprises a second receiving unit 5. The second receiving unit 5 is preferably connected via a signal probe 11 to the input node 1a of the DUT 1. The first receiving unit 4 and/or the second receiving unit 5 has a broad bandwidth such as from 0 Hz (DC) to for example 1 GHz or 10 GHz or even 100 GHz. Additionally, the DUT 1 is terminated with a termination element 13 at the output node 1b of the DUT 1. Also, the signal probe 11 for connecting the receiving unit 4 with the output node 1b of the DUT 1 is drawn.

In comparison to FIG. 1, in FIG. 2 the measurement device 2 also obtains the generated signal applied to the input node 1*a* of the DUT 1 directly from the input node 1*a* of the DUT 1. Thus, unwanted transmission losses obtained from the connecting cable for applying the adjustable signal from the signal generation unit 3 to the input node 1*a* of the DUT are not further analyzed and do not influence the calculation result in the controlling unit 6 of the measurement device 2. Thus, the embodiment according to FIG. 2 is more accurate than the embodiment of FIG. 1. As shown in FIG. 2, the output node 1*b* of the DUT 1 is terminated with a termination element 13. The termination element 13 is preferably a 50 Ohms resistance. Thus, the DUT 1 can be evaluated during normal operating conditions.

Figure 3:
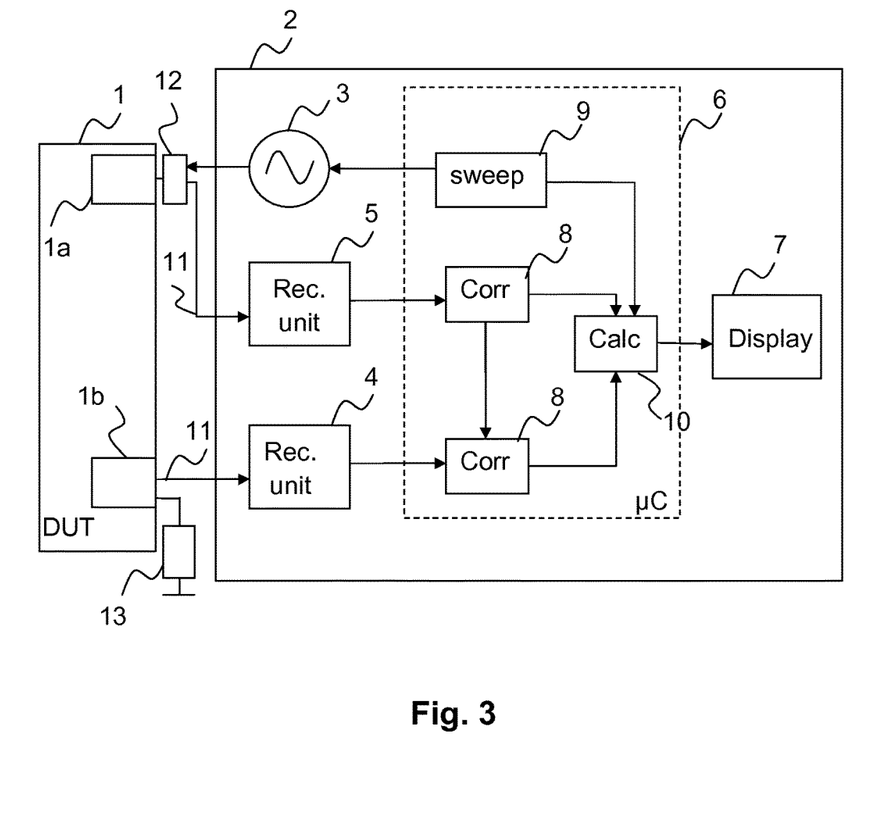
FIG. 3 shows a third exemplary embodiment of an electronic measurement device according to the invention.

In FIG. 3, a third exemplary embodiment of the inventive measurement device 2 is shown. In comparison to FIG. 2, in FIG. 3 the control unit 6 is shown with greater details. The control unit 6 according to FIG. 3 comprises a sweep unit 9 that is configured to provide operational commands to the signal generating unit 3 for adjusting the adjustable signal values to the input node 1*a* of the DUT 1. Furthermore, the controlling unit 6 comprises a calculation unit 10 which obtains an input value from the sweeping unit 9 as well as the retrieved signals from the receiving unit 4 and the second receiving unit 5. The calculation unit 10 compares the retrieved signals from the DUT 1 with the applied signal to the DUT 1 and preferably calculates specific parameters. The calculation unit 10 provides calculation results to the display unit 7. Thus, the calculation results are displayed at the display unit 7.

For instance, the DUT 1 is an operational amplifier. The analyzed parameters might be a gain value and a phase value over the frequency range of the DUT 1. Thus, the frequency response of the gain and the phase are analyzed. Therefore, the sweeping unit 9 obtains a predefined start frequency value, a predefined stop frequency value and a predefined step-width value to adjust the signal frequency of the adjustable signal that is applied to the input node 1*a* of the DUT 1.

The second receiving unit 5 obtains the signal from the input node 1*a* of the DUT 1. The receiving unit 4 retrieves the signal from the output node 1*b* of the DUT 1. The calculation unit 10 compares the retrieved signal from the receiving unit 5 with the retrieved signal from the receiving unit 4 in order to obtain the gain value for each specific adjusted signal frequency value. This value is then stored in a storage means of the measurement device 2 and/or displayed on the display unit 7.

In FIG. 3, an impedance mismatch between the input node 1*a* of the DUT 1 and the output node of the measurement device is further shown. In case, the termination element 13 comprises a terminating impedance value that is different from an expected termination value an impedance mismatch occurs. Thus, a correcting-impedance value is needed in order to obtain evaluation results that are useful to analyze the DUT 1. The correction value is obtained by insertion of an impedance correction element 12 in-between the signal generating unit 3 and the input node 1*a* of the DUT 1. Since this correction mismatch impedance value from correction element 12 is known, it can be used in a correcting unit 8 of the controlling unit 6 to obtain mismatch corrected values at the calculation unit 10.

Figure 4:
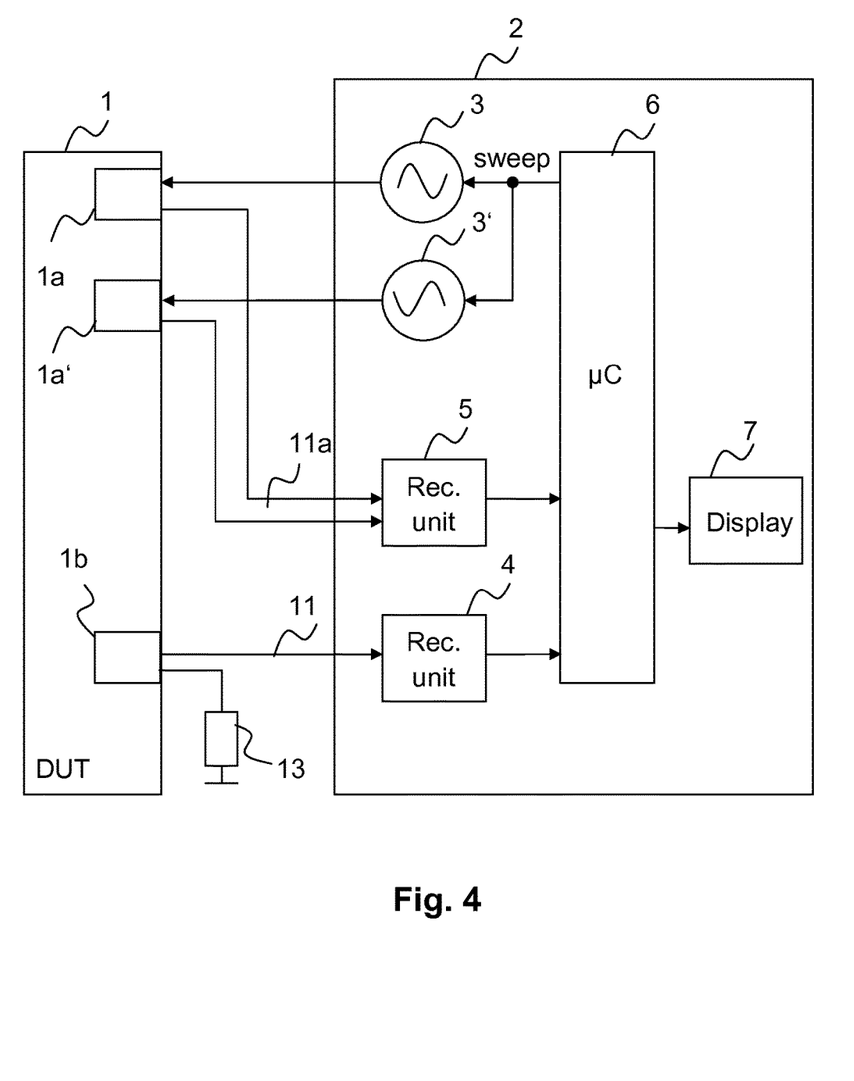
FIG. 4 shows a fourth exemplary embodiment of an electronic measurement device according to the invention.

In FIG. 4 a fourth exemplary embodiment of the invention is shown. The DUT comprises a first input node 1*a* and a second input node 1*a'*, wherein signals generated by the signal generation unit 3 and 3' are applied thereto. The controlling unit 6 comprises a sweeping unit 9 to provide commands to the signal generating unit 3. The measuring device 2 is capable of outputting two independent signal generating signals that are phase related with 180 degree phase difference. Thus, at the input nodes 1*a* and 1*a'* of the DUT 1, a differential signal is applied. This differential signal can be retrieved at the measurement device 2 using differential signal probe 11*a* at the receiving unit 5. The output node 1*b* of the DUT 1 also provides an output signal that is retrieved at the receiving unit 4 via a single-ended signal probe 11. Using the arrangement of FIG. 4 it is possible to measure a common mode rejection ratio which is needed to classify an operational amplifier within a test specification.

Figure 5:
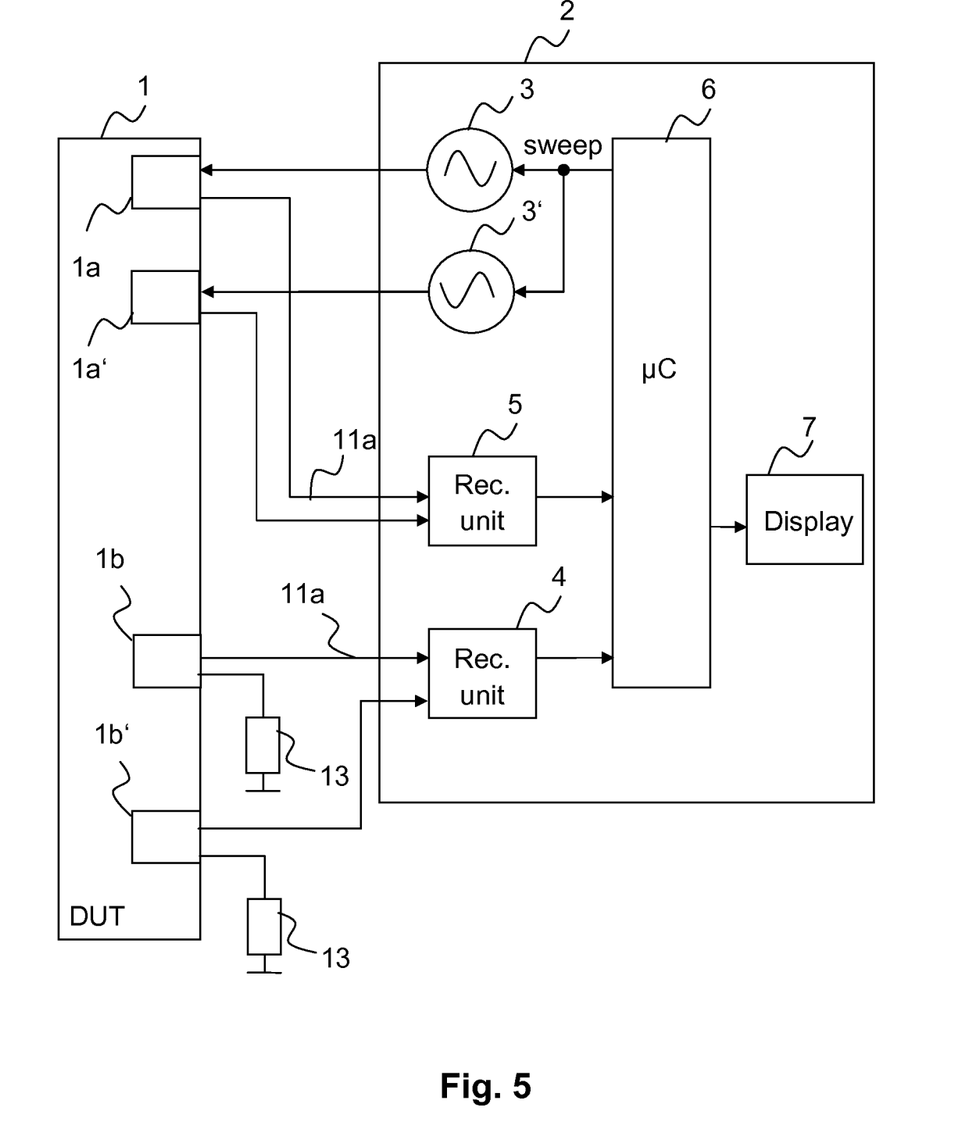
FIG. 5 shows a fifth exemplary embodiment of an electronic measurement device according to the invention.

In FIG. 5 a fifth exemplary embodiment of the invention is shown. In the following, only the structural differences between the embodiment according to FIG. 4 and FIG. 5 are explained to avoid unnecessary repetitions. The DUT 1 also comprises a first output node 1*b* and a second output node 1*b'* on which a differential output signal of the DUT 1 can be derived. The output node 1*b*, 1*b'* is terminated by a termination element 13. This differential output signal of the DUT 1 can be retrieved at the measurement device 2 using a second differential signal probe 11*a* at the receiving unit 4. Using the arrangement of FIG. 5 it is possible to measure a common mode rejection ratio which is needed to classify an operational amplifier within a test specification.

Figure 6:
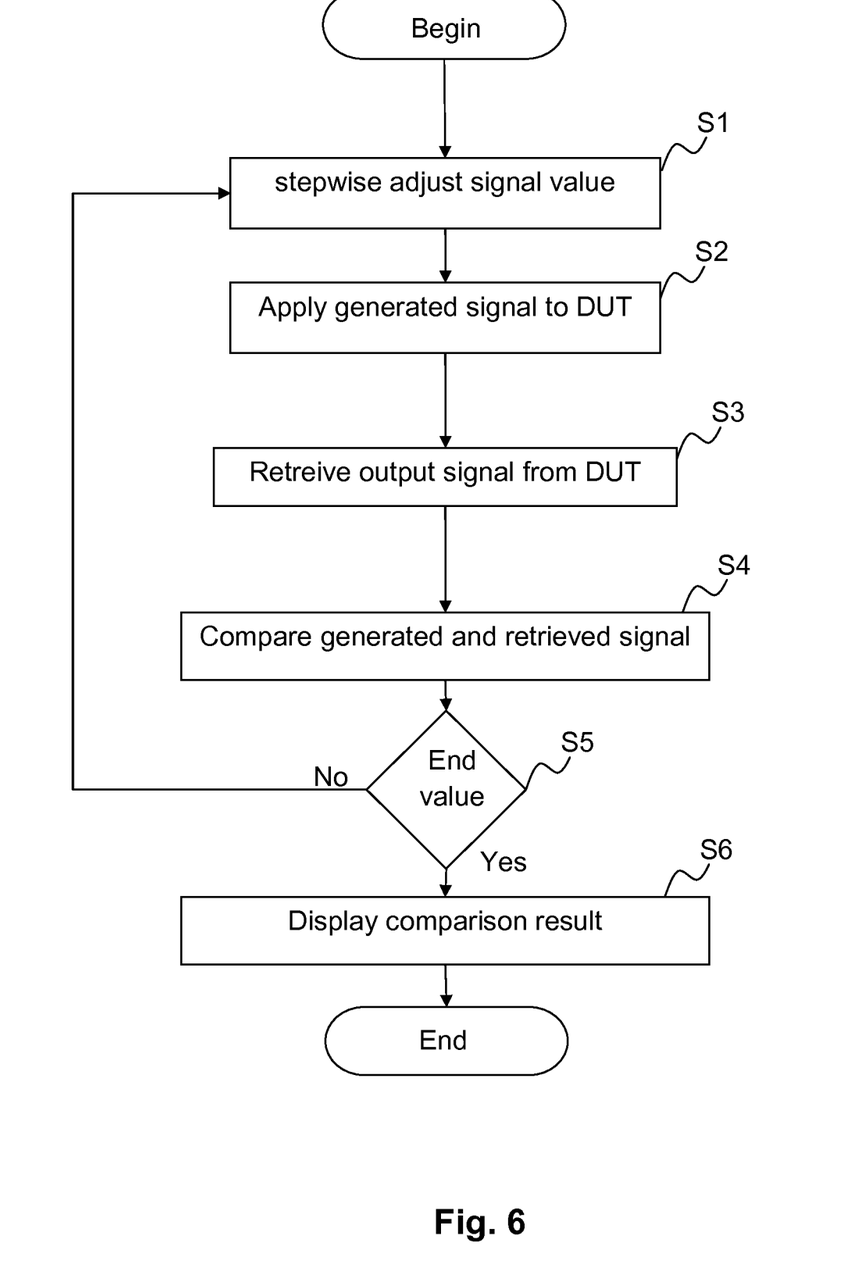
FIG. 6 shows an exemplary embodiment of a flow diagram illustrating an operating method according to the invention.

Now referring to FIG. 6, an exemplary embodiment of an operating method is shown in a schematic diagram. Therein, according to a first step S1, a stepwise adjustment of the signal value is needed. The signal value is especially a frequency value but alternatively can be an amplitude value or a phase value. According to step S2, this adjusted signal value is applied to an input node 1*a* of a DUT 1. In step S3, an appropriate output signal from an output node 1*b* of the DUT 1 is retrieved at the receiving unit 4. According to step S4, a comparison of the applied signal and the retrieved signal in the controlling unit 6 is processed. According to step 5, it is tested whether the adjusted signal value is equal to a predefined end value. For instance if a stop frequency of 100 Megahertz is predefined and the stepwise adjusted signal value is equal to 100 Megahertz, the end value is equal to the signal value according to step S5 and the result is displayed at the display unit 7, see step s6. In case, the end value is not equal to the stepwise adjusted signal value, the signal value is increased according to the predefined step width and the steps S2, S3 and S4 are repeated. The steps S1 to S5 are repeated as often as the signal value is not equal to the predefined end value. In step S6 of the operating method, the comparison results according to step S4 are displayed on the display unit 7 of the measurement device 2.

Figure 7:
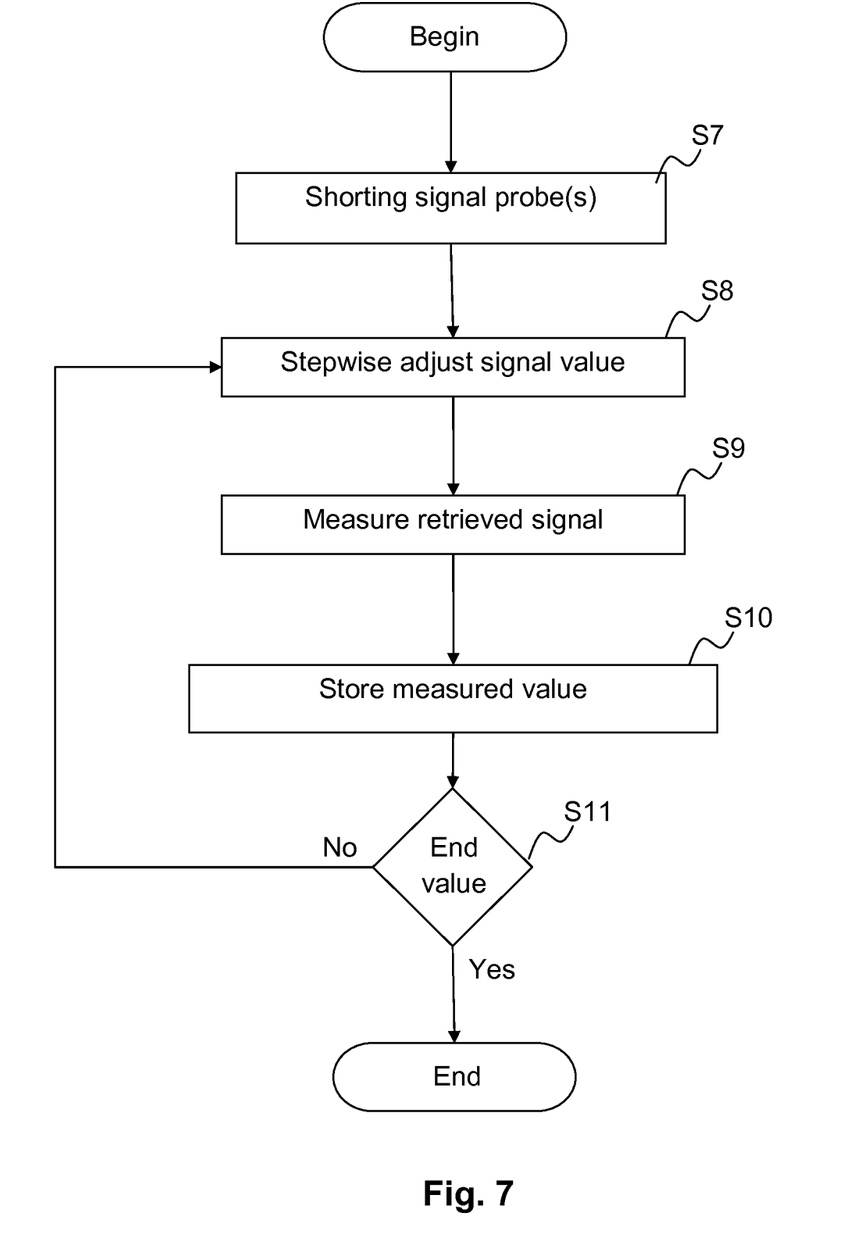
FIG. 7 shows an exemplary embodiment of a flow diagram illustrating a normalization procedure according to the invention.

Now referring to FIG. 7, an exemplary embodiment of a normalization procedure prior to the comparing step S4 of FIG. 6 is shown. Accordingly, in step S7, all signal probes 11, 11*a* connected to each receiving unit 4, 5 are shorted. In step S8, again a stepwise adjustment of the signal values is proceeded. In step S9, the retrieved signal at the receiving unit 4, 5 are measured. Those measured values are stored according to step S10. In case, the adjusted signal value is not equal to an end value, see step S11, the steps S8 to S11 are repeated as long as the end value is not the adjusted signal value. In case, the predefined end value is achieved, the normalization procedure is completed. These stored measured values are used to normalize the measurement device 2 within each calculation process. Thus, the internal errors of the measurement device 2 cannot influence the comparison result.

Figure 8:
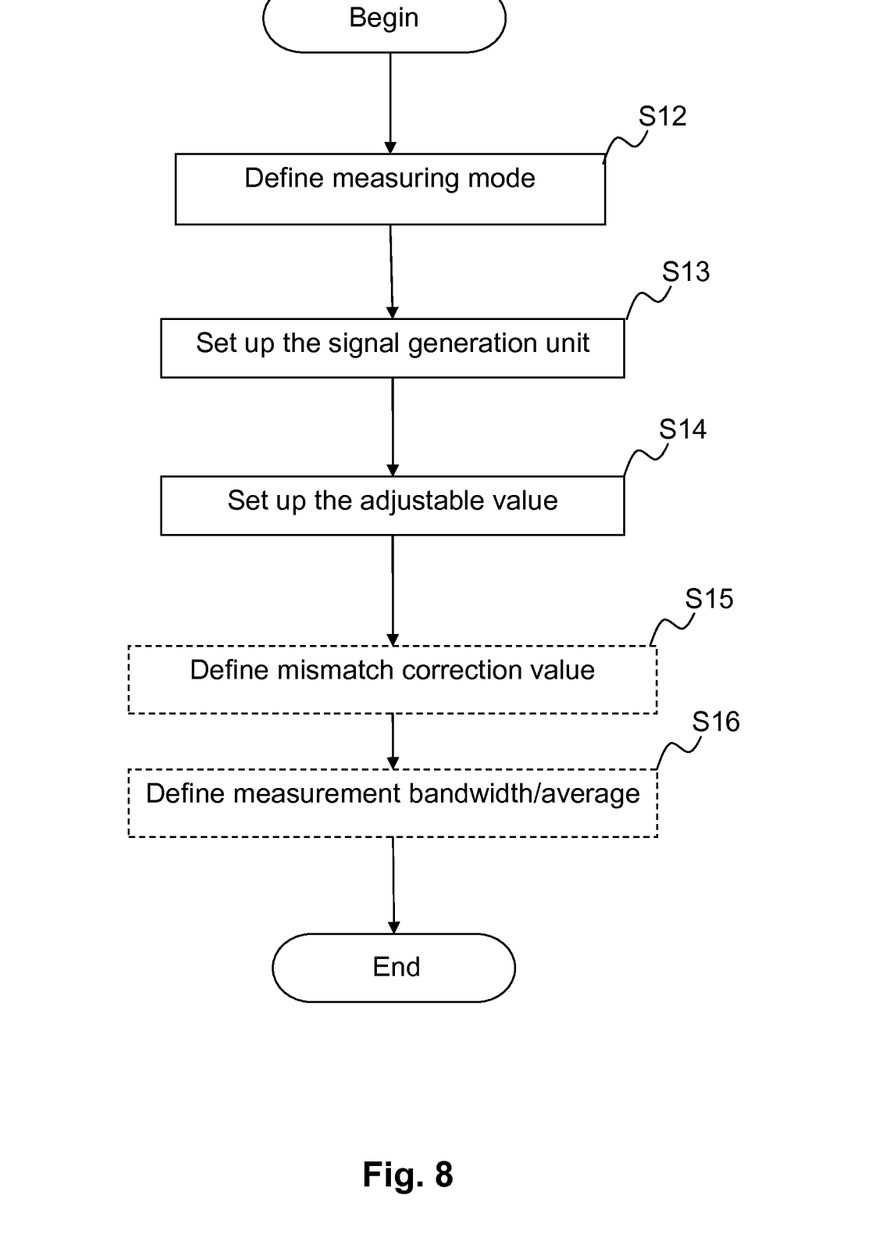
FIG. 8 shows an exemplary embodiment of a flow diagram illustrating a measurement definition procedure according to the invention.

According to FIG. 8, an exemplary embodiment of a measurement definition procedure prior to the comparing step S4 according to FIG. 6 is shown. Therein, in step S12, a measuring mode is defined. A measuring mode is for instance a single-ended measuring mode or a differential-measuring mode. Alternatively, the measuring mode defines the specific signal value that need to be adjusted, such as signal frequency, signal amplitude or signal phase.

According to step 13, the signal generating unit is set up. Especially, a start value and a stop value of the specific signal value are predefined and a characteristic step width is adjusted. For instance, a predefined start frequency value of 1 Hertz is set. For instance, a predefined stop frequency value of 100 Megahertz is set. For instance, a predefined step-width of 10 Millihertz is set, wherein other values are not excluded from the inventive concept.

According to step S14, the adjustable signal value is set up. Optionally, in step S15, a mismatch correction value is defined which needs to be used in case an impedance mismatch between the DUT 1 and the measurement device 2 is achieved. In step S16, a measurement bandwidth and an average are predefined which is useful for the display unit 7.

The inventive measurement device comprises a signal generating unit 3 which might be an arbitrary wave form generator. The arbitrary wave form generators are adjustable in view of their signal wave form, their signal frequency, their signal amplitude, their signal phase and further signal parameters.

Preferably, the display unit 7 is able to display the obtained values with a bode diagram.

With this approach, applications like an LCR-meter or impedance spectroscopy application is achieved. For instance, an electrochemical impedance spectroscopy is applied to analyze a battery. For instance, an electrochemical impedance spectroscopy is applied to analyze liquids, for instance motor oils, blood substances or the like.

The evaluated DUTs 1 are preferably amplifiers, such as operational amplifiers to obtain a gain value and a phase value within a predefined frequency range such as DC to a few hundreds of Megahertz. Alternatively, the DUT is a passive element like a filtering element or a cable or an inductance, a capacitance or a resistance element. Alternatively, the DUT 1 is a switched-mode power supply, short SMPS, wherein the analyzed value is a PSRR value. Alternatively, the DUT 1 is an oscillator wherein a bode-plot is used to classify the oscillator.

All features of all embodiments described, shown and/or claimed herein, can be combined with each other.

While various embodiments of the present invention have been described above, it should be understood that they have been presented by way of example only and not limitation. The merely changes to the disclosed embodiments can be made in accordance with the disclosure herein without departing from the spirit or scope of the invention. Thus, the breadth and the scope of the present invention should not be limited by any of the above-described embodiments. Rather, the scope of invention should be defined in accordance with the following claims and their equivalence.

Although the invention has been illustrated described with respect to one or more implementations, equivalent alterations or modifications will occur to those skilled in the art up in the reading and understanding of this specification and the annexed drawings. In addition, while a particular feature of the invention may have been disclosed with respect to only one of several implementations, such feature may be combined with one or more other feature of the other implementations as may be desired and advantages for any given or particular application.

What is claimed is:
1. An electronic measurement device, comprising:
 a signal generation unit, which is configured to generate a signal that is applied to an input node of a device under test;
 a controlling unit which is configured to control the signal generation unit in that the generated signal is at least adjustable in its signal frequency;
 a sweeping unit, which obtains a predefined start frequency value, a predefined stop frequency value, and a predefined step-width value to adjust a signal frequency of the generated signal that is applied to the input node of the device under test; and
 at least a receiving unit, wherein the receiving unit retrieves a signal from an output node of the device under test in time domain and has a broadband input bandwidth,
 wherein a high impedance probe is applied to an input node of the receiving unit,
 wherein the electronic measurement device is configured to perform a normalization procedure prior to a comparing step in order to avoid the influence of one or more internal errors of the electronic measuring device, and
 wherein the normalization procedure comprises the following steps:
  shorting of an appropriate signal probe that is connected to the receiving unit for retrieving the signal from the output node of the device under test;
  stepwise adjusting a signal value of the generated signal;
  measuring the retrieved signal with the shorted probe; and
  storing a measured value for each adjusted signal value.
2. The electronic measurement device according to claim 1, wherein the controlling unit adjusts the signal frequency in a stepwise manner, wherein a step width value is adjustable.
3. The electronic measurement device according to claim 1, wherein the generated signal is a single-frequency-signal.
4. The electronic measurement device according to claim 1, wherein the signal generation unit is an arbitrary waveform generator.
5. The electronic measurement device according to claim 1, wherein the electronic measurement device comprises at least a second receiving unit, wherein the second receiving unit retrieves the generated signal from the input node of the device under test.
6. The electronic measurement device according to claim 1, wherein the controlling unit analyzes the device under test behavior by comparing the generated signal and the retrieved signal.
7. The electronic measurement device according to claim 1, wherein a high-impedance probe is applied to an input node of the receiving unit, wherein the impedance of the high-impedance probe is higher than the impedance of the output node of the device under test.
8. The electronic measurement device according to claim 1, wherein the controlling unit comprises a correction unit that is configured to compensate an impedance mismatch between the receiving unit and the output node of the device under test.
9. The electronic measurement device according to claim 1, wherein the controlling unit comprises a correction unit that is configured to compensate an impedance mismatch between the signal generating unit and the input node of the device under test.
10. The electronic measurement device according to claim 1, wherein the controlling unit is configured to cal- culate a gain value and/or a phase value by comparing the generated signal and the retrieved signal for each generated adjustable signal value.

11. The electronic measurement device according to claim 1, wherein the measurement device comprises a display unit to display the generated signal and/or the retrieved signal and/or any signal derived from the controlling unit.

12. The electronic measurement device according to claim 11, wherein the display unit is configured to display at least a signal in a frequency domain.

13. The electronic measurement device according to claim 1, wherein the device under test is an amplifier device or a passive element.

14. The electronic measurement device according to claim 1, wherein the measurement device is a digital oscilloscope.

15. A method for operating an electronic measurement device, the method comprises the following steps:
   applying a generated signal to an input node of a device under test, wherein the generated signal is generated by a signal generation unit of the measurement device and wherein the generated signal is at least adjustable in its signal frequency by a controlling unit of the electronic measurement device;
   retrieving an output signal from an output node of the device under test at a receiving unit of the electronic measurement device, which has a broadband input bandwidth;
   applying a high impedance probe to an input node of a receiving unit of the electronic measurement device;
   comparing the retrieved signal with the generated signal by the controlling unit to obtain parameters of the device under test;
   obtaining a predefined start frequency value, a predefined stop frequency value, and a predefined step-width value by a sweeping unit to adjust a signal frequency of the generated signal that is applied to the input node of the device under test;
   normalizing prior to a comparing step in order to avoid the influence of one or more internal errors of the electronic measuring device; and
   displaying results of the comparing step at a display unit of the electronic measurement device, and
   wherein the normalizing comprises the following steps:
      shorting of an appropriate signal probe that is connected to the receiving unit for retrieving the signal from an output node of the device under test;
      stepwise adjusting a signal value of the generated signal;
      measuring the retrieved signal with the shorted probe; and
      storing a measured value for each adjusted signal value.

16. The method according to claim 15, wherein the electronic measurement device comprises a second receiving unit for retrieving the generated signal from the input node of the device under test.

17. The method according to claim 15, wherein prior to the comparing step, a measurement definition procedure is applied, wherein the measurement definition procedure comprises the following steps:
   defining a measuring mode;
   setting up the signal generation unit; and
   setting the adjustable values for the generated signal.

18. The method according to claim 17, wherein the measurement definition procedure further comprises the steps of:
   defining a mismatch correction value of the device under test; and
   defining a measurement bandwidth and an averaging value.

19. The method according to claim 15, wherein the comparing step includes the following sub-steps:
   incorporating mismatch parameters of the device under test into the comparing step;
   calculating a gain value from the generated signal and the retrieved signal for each adjusted signal value; and/or
   calculating a phase value between the generated signal and the retrieved signal for each adjusted signal value.

20. The method according to claim 15, wherein the electronic measuring device is an oscilloscope.

* * * * *